(12) United States Patent
Kang et al.

(10) Patent No.: US 10,768,733 B2
(45) Date of Patent: Sep. 8, 2020

(54) ELECTRONIC DEVICE HAVING TOUCH SENSOR AND DISPLAY DEVICE

(71) Applicant: LG DISPLAY CO., LTD., Seoul (KR)

(72) Inventors: Yeonsuk Kang, Paju-si (KR); Hyejin Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 16/189,793

(22) Filed: Nov. 13, 2018

(65) Prior Publication Data

US 2019/0146622 A1    May 16, 2019

(30) Foreign Application Priority Data

Nov. 15, 2017    (KR) .................. 10-2017-0152118

(51) Int. Cl.
*G09G 1/00* (2006.01)
*G06F 3/041* (2006.01)
*G06F 3/044* (2006.01)

(52) U.S. Cl.
CPC ............ *G06F 3/0412* (2013.01); *G06F 3/044* (2013.01); *G06F 2203/04103* (2013.01); *G06F 2203/04111* (2013.01)

(58) Field of Classification Search
CPC . G06F 3/041; G06F 3/044; G06F 3/03; G06F 3/038
See application file for complete search history.

(56) References Cited

U.S. PATENT DOCUMENTS

2016/0253030 A1* 9/2016 Tada ................. G06F 3/041
                                                  345/174
2016/0299370 A1* 10/2016 Wu .................... G02F 1/13338

* cited by examiner

*Primary Examiner* — Michael A Faragalla
(74) *Attorney, Agent, or Firm* — Birch, Stewart, Kolasch & Birch, LLP

(57) ABSTRACT

An electronic device having a touch sensor, the electronic device can include a display panel including an active area and an encapsulating substrate covering the active area; a plurality of recesses in a surface of the encapsulating substrate; and a touchscreen including a lower metal layer disposed in the plurality of recesses, and a touch electrode layer electrically connected to a part of the lower metal layer and including touch driving electrodes and touch sensing electrodes separately arranged on the encapsulating substrate.

18 Claims, 12 Drawing Sheets

Fig. 3
(a)
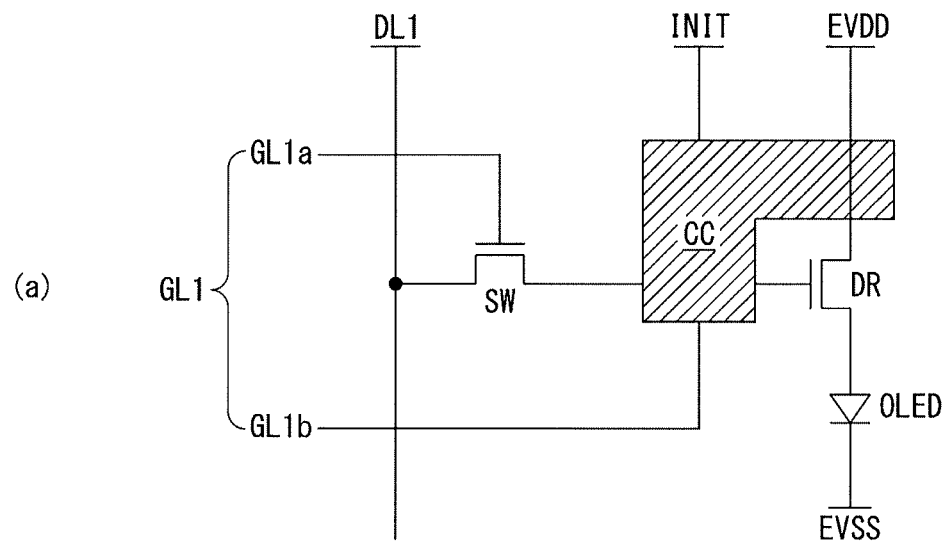
(b)
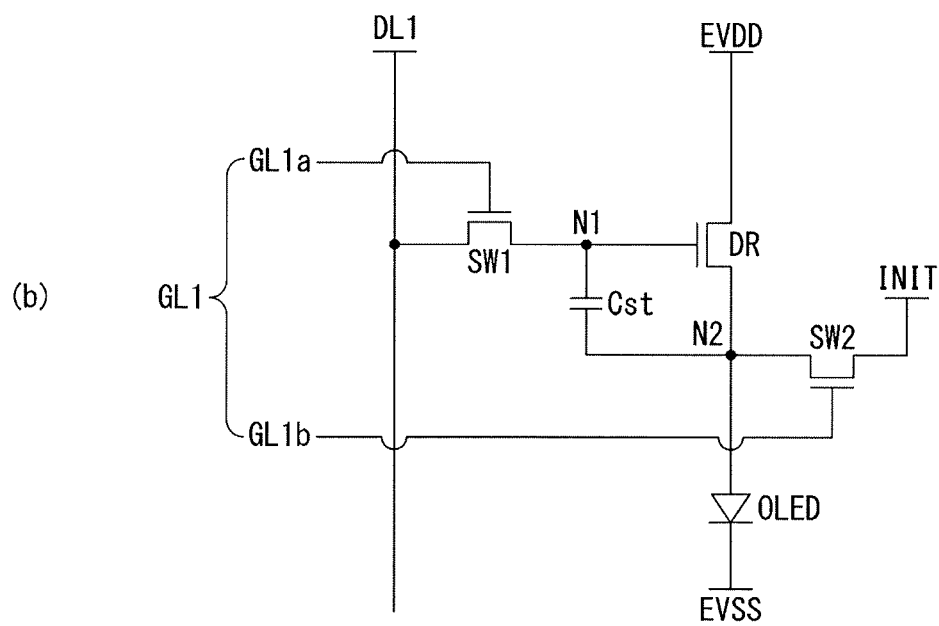

Fig. 10
(a) 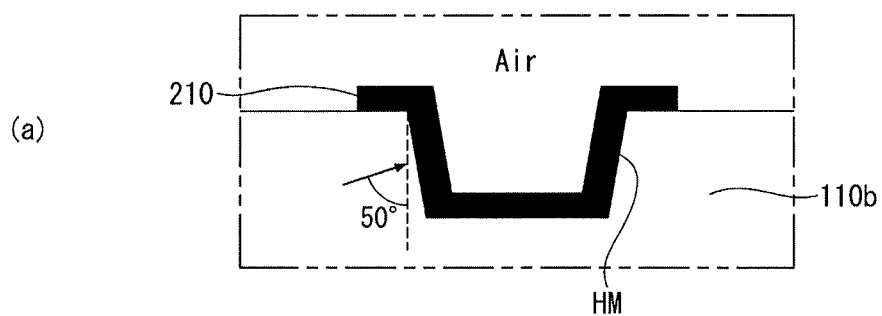
(b) 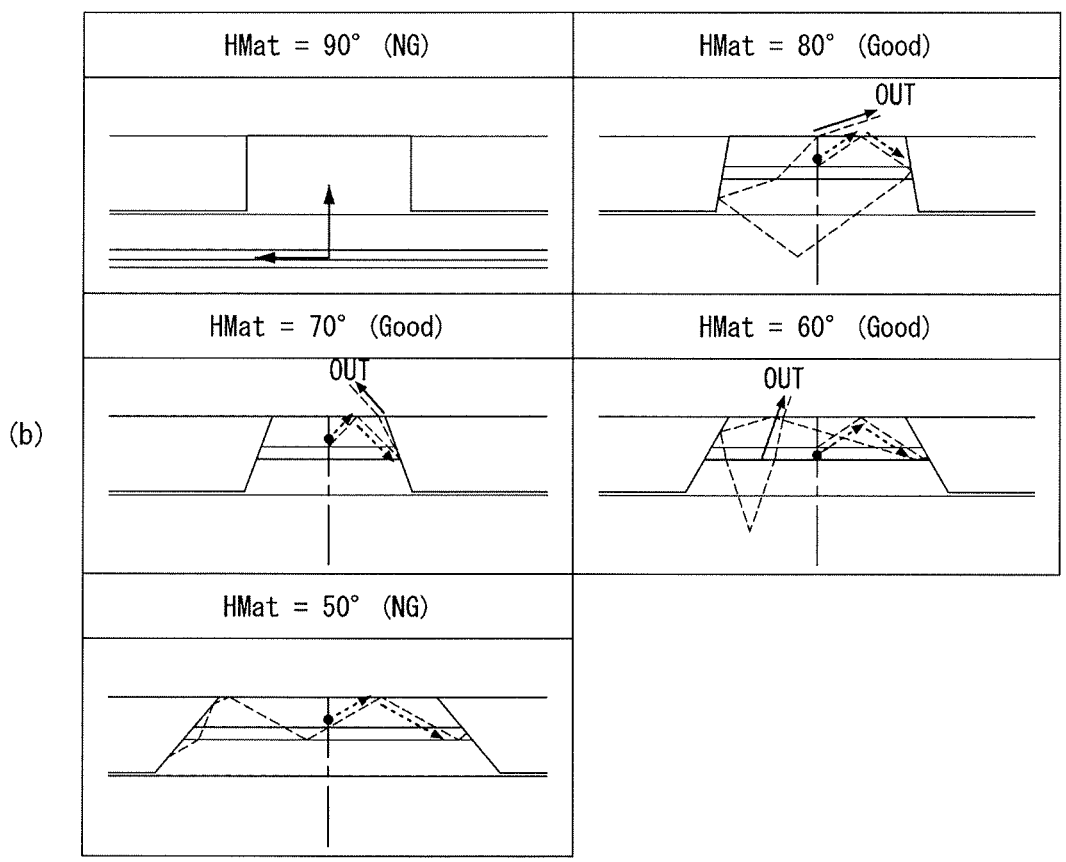

ELECTRONIC DEVICE HAVING TOUCH SENSOR AND DISPLAY DEVICE

CROSS-REFERENCE TO RELATED APPLICATIONS

This application claims the benefit of Korean Patent Application No. 10-2017-0152118, filed in the Republic of Korea on Nov. 15, 2017, which is incorporated herein by reference for all purposes as if fully set forth herein.

BACKGROUND OF THE INVENTION

Field of the Invention

The present invention relates to an electronic device having a touch sensor and a display device.

Related Art

User interfaces (UIs) enable a person (user) to easily control various electronic devices. Examples of user interfaces include a keypad, a keyboard, a mouse, an on-screen display, a remote controller having an infrared or radio frequency (RF) communication function, etc. User interface technology has been developed to improve the emotional experience and operation convenience of users. User interfaces are evolving into a touch UI, a voice recognition UI, a 3D UI, etc.

The touch UI may be a touchscreen included in a display panel of a display device. Capacitance type, resistance type and pressure variation type touchscreens are proposed and, particularly, the capacitance type touchscreen is widely used. A touchscreen having a capacitance type touch sensor detects touch input by sensing capacitance variation according to input of a touchscreen driving signal, that is, charge variation in the touch sensor, when a finger or a conductive object contacts (approaches) the touch sensor.

The capacitance type touch sensor may be realized as a self-capacitance sensor or a mutual capacitance sensor. Electrodes of the self-capacitance sensor may be connected one-to-one to sensor lines formed in one direction. The mutual capacitance sensor may be formed at the intersection of sensor lines which intersect each other having a dielectric layer formed therebetween.

Recently, technology related to touchscreens, such as forming a touch sensor inside or outside (on an upper substrate or an upper film) of a display panel, has been continuously developed. However, regarding the method of forming a touch sensor outside of a display panel, constant research needs to be conducted in order to improve a touch sensing function and display quality.

SUMMARY OF THE INVENTION

The present invention provides an electronic device having a touch sensor, which includes a display panel and a touchscreen. The display panel has recesses depressed from the surface of an encapsulating substrate covering an active area. The touchscreen includes a lower metal layer positioned on the recesses, and a touch electrode layer which is electrically connected to part of the lower metal layer, isolated and separately arranged on the encapsulating substrate to form Tx electrodes and Rx electrodes.

In another aspect, the present invention provides a display device including: recesses depressed from the surface of an encapsulating substrate covering an active area of a display panel; and a lower metal layer positioned on the recesses.

BRIEF DESCRIPTION OF THE DRAWINGS

The accompany drawings, which are included to provide a further understanding of the invention and are incorporated in and constitute a part of this specification illustrate embodiments of the invention and together with the description serve to explain the principles of the invention.

FIG. 3, including (a) and 3(b), illustrates example circuit configurations of a part of FIG. 2 according to embodiments of the present invention.

FIG. 10, including (a) and (b), is a diagram showing simulation results based on the second embodiment of the present invention.

DETAILED DESCRIPTION OF THE EMBODIMENTS

Reference will now be made in detail to embodiments of the invention, examples of which are illustrated in the accompanying drawings.

Hereinafter, specific embodiments of the present invention will be described with reference to the attached drawings.

An electronic device having a touch sensor according to an embodiment of the present invention is realized as a TV, a set-top box, a navigation system, a video player, a Blu-ray player, a personal computer (PC), a home theater, a smartphone, etc. The electronic device having a touch sensor according to an embodiment of the present invention includes a touchscreen realized using capacitance type touch sensors. Touchscreens may be configured as a self-capacitance type or a mutual capacitance type.

Figure 1:
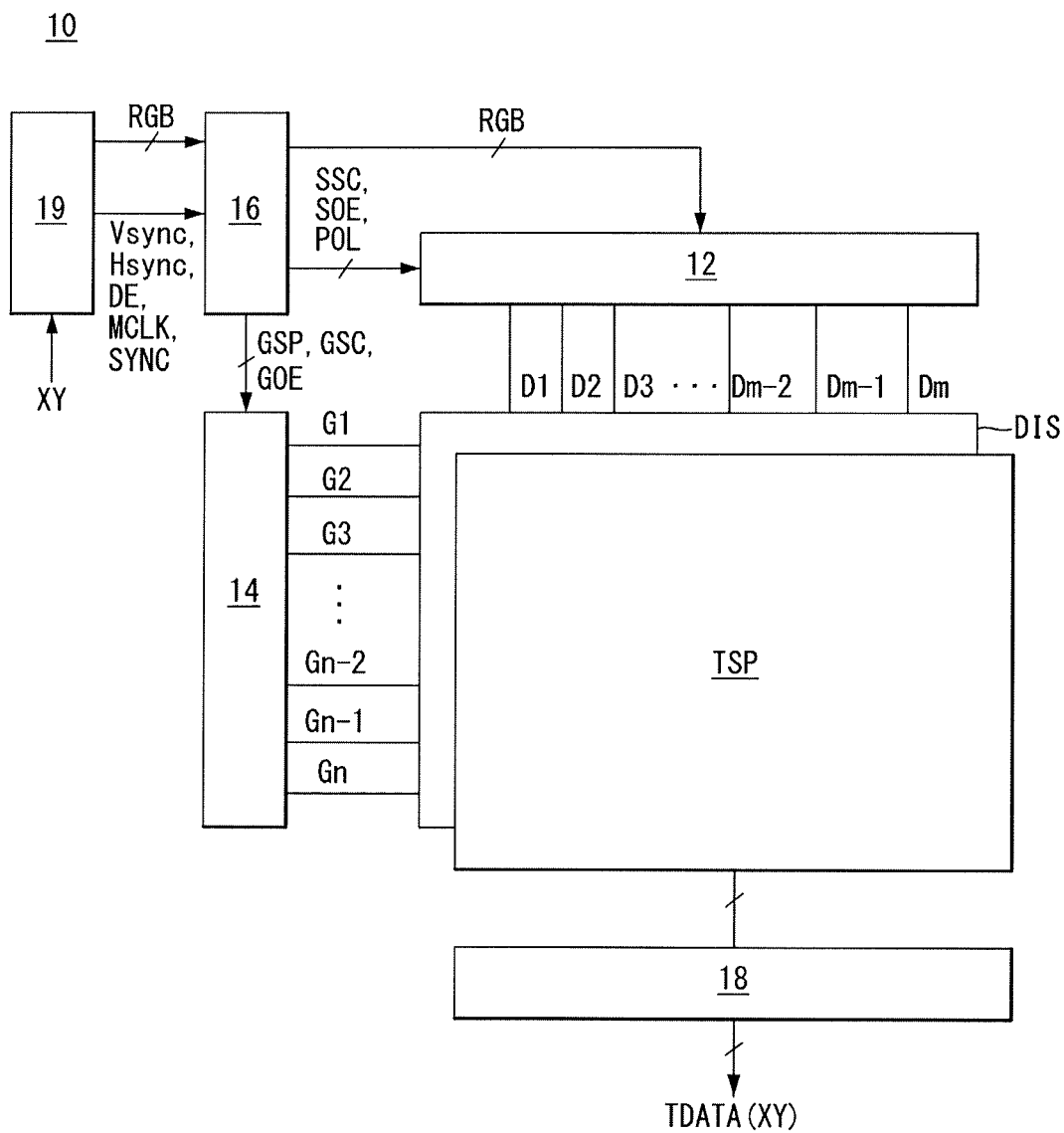
FIG. 1 is a diagram schematically illustrating an electronic device having a touch sensor according to an embodiment of the present invention.
Figure 2:
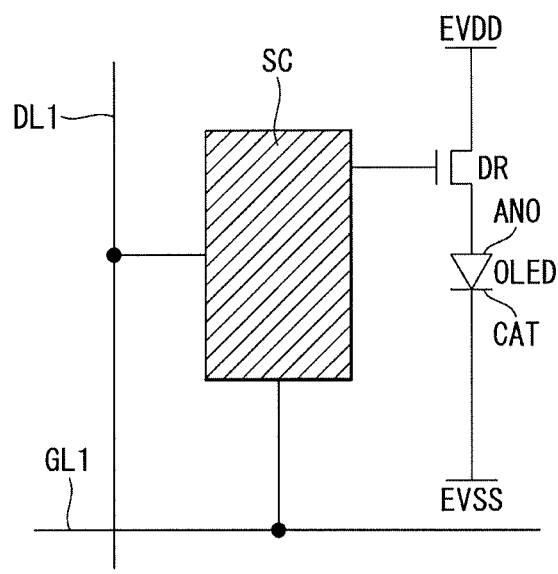
FIG. 2 is a schematic circuit diagram of a sub-pixel according to an embodiment of the present invention.
Figure 4:
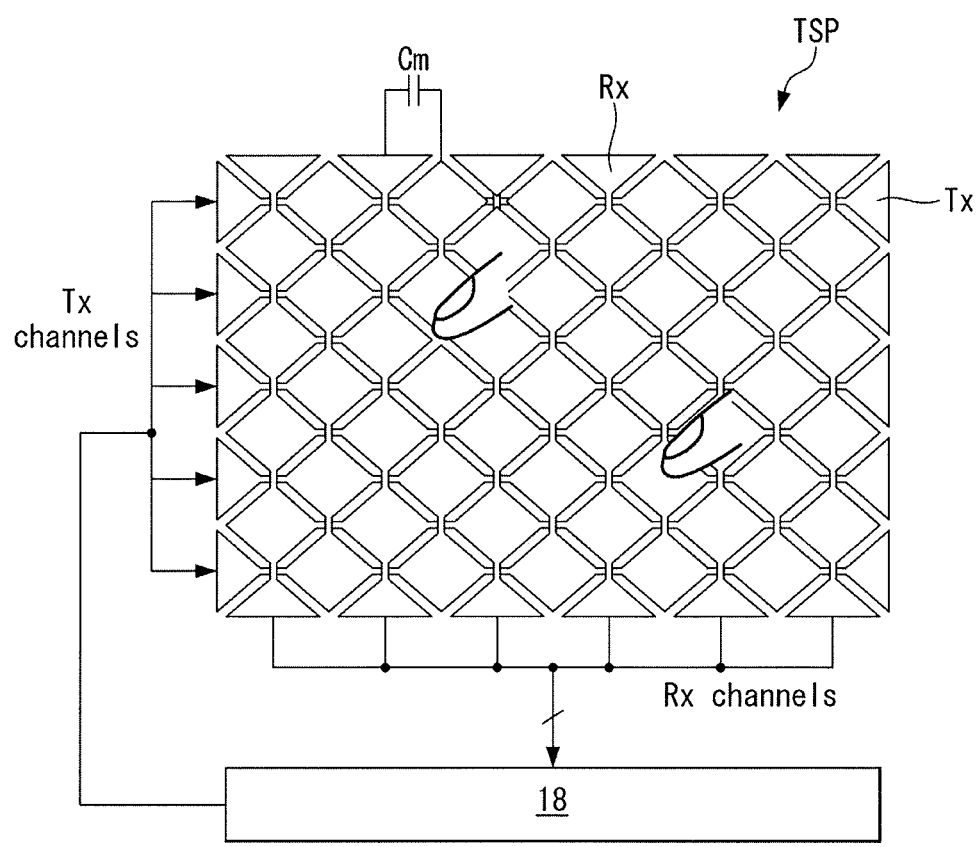
FIG. 4 is a diagram illustrating describing a touchscreen using a mutual capacitance sensor according to an embodiment of the present invention.

FIG. 1 is a diagram schematically illustrating an electronic device having a touch sensor according to an embodiment of the present invention, FIG. 2 is a schematic circuit diagram of a sub-pixel according to an embodiment of the present invention, FIG. 3, including (a) and 3(b), illustrate example circuit configurations of a part of FIG. 2 according to embodiments of the present invention, and FIG. 4 is a diagram illustrating a touchscreen using a mutual capacitance sensor according to an embodiment of the present invention.

As shown in FIG. 1, an electronic device 10 having a touch sensor includes a display module and a touch module. The display module may include a display panel DIS, display driving circuits 12, 14 and 16 and a host system 19, and the touch module may include a touchscreen TSP and a touch driving circuit 18. The electronic device 10 having a touch sensor can be driven in a display driving period in which the display panel DIS displays an image and a touch sensor driving period in which the touchscreen TSP is sensed in a time division manner.

The display driving circuits includes a data driving circuit 12, a gate driving circuit 14 and a timing controller 16 and write input digital video data RGB into sub-pixels of the display panel DIS.

The data driving circuit 12 converts a digital data signal RGB input from the timing controller 16 into an analog data voltage and outputs the analog data voltage. The data voltage output from the data driving circuit 12 is provided to data lines D1 to Dm. The gate driving circuit 14 sequentially supplies a gate pulse (or scan pulse) signal synchronized with the data voltage to gate lines G1 to Gn to select sub-pixel lines of the display panel DIS into which the data voltage is written. The gate driving circuit 14 may be arranged on the substrate of the display panel DIS along with sub-pixels.

The timing controller 16 receives timing signals such as a vertical synchronization signal Vsync, a horizontal synchronization signal Hsync, a data enable signal DE and a main clock signal MCLK input from the host system and synchronizes operation timing of the data driving circuit 12 with operation timing of the gate driving circuit 14. Scan timing control signals include a gate start pulse signal GSP, a gate shift clock signal GSC, a gate output enable signal GOE and the like. Data timing control signals include a source sampling clock signal SSC, a polarity control signal POL, a source output enable signal SOE and the like.

The host system 19 may transmit the digital data signal RGB along with the timing signals Vsync, Hsync, DE and MCLK to the timing controller 16 and execute an application program associated with touch coordinate information XY input from the touch driving circuit 18.

The host system 19 refers to a system including an electronic device to which the device according to an embodiment of the present invention is applicable. For example, the host system 19 may be any of a phone system, a TV system, a set-top box, a navigation system, a DVD player, a Blu-ray player, a personal computer (PC) and a home theater system.

The display panel DIS includes sub-pixels formed at regions defined by the data lines D1 to Dm (m being a positive integer) and the gate lines G1 to Gn (n being a positive integer). The sub-pixels emit light in response to a data voltage supplied through the data lines D1 to Dm and a gate signal supplied through the gate lines G1 to Gn.

The display panel DIS may be realized based on a display device such as liquid crystal display (LCD), a field emission display (FED), a light emitting diode display (LED) or an electrophoresis display (EPD). However, the display device is realized as the LED as an example in the following embodiments.

Referring to FIG. 2, a sub-pixel is positioned at the intersection of a data line DL1 and a scan line GL1, and the sub-pixel includes a programming unit SC for setting a gate-source voltage of a driving transistor DR and an organic light-emitting diode (OLED). The OLED includes an anode ANO, a cathode CAT and an organic emission layer interposed between the anode ANO and the cathode CAT. The anode ANO is connected to the driving transistor DR.

The programming unit SC may be realized as a transistor unit (a transistor array) including at least one switching transistor and at least one capacitor. The transistor unit is realized based on a CMOS semiconductor, a PMOS semiconductor or an NMOS semiconductor. Transistors included in the transistor unit may be implemented as a p type or an n type transistor. A semiconductor layer of the transistors included in the transistor unit of the sub-pixel may include amorphous silicon, polysilicon or oxide.

The switching transistor is turned on in response to a scan signal from the scan line GL1 to apply a data voltage from the data line DL1 to one electrode of a capacitor. The driving transistor DR controls the quantity of current in response to the level of a voltage charged in the capacitor to adjust the quantity of light emitted from the OLED. The quantity of light emitted from the OLED is proportional to the quantity of current supplied from the driving transistor DR. In addition, the sub-pixel is connected between a first power line EVDD and a second power line EVSS, and provided with a high voltage and a low voltage through the first power line EVDD and the second power line EVSS.

Referring to (a) of FIG. 3, the sub-pixel may include an internal compensating circuit CC as well as the aforementioned switching transistor SW, driving transistor DR, capacitor Cst and OLED. The internal compensating circuit CC may include one or more transistors connected to a compensating signal line INIT.

The internal compensating circuit CC sets a gate-source voltage of the driving transistor DR to a voltage in which the threshold voltage of the driving transistor DR has been reflected to exclude luminance variation caused by the threshold voltage of the driving transistor DR when the OLED emits light. In this instance, the scan line GL1 includes at least two scan lines GL1a and GL1b in order to control the switching transistor SW and the transistors of the internal compensating circuit CC.

Referring to (b) FIG. 3, the sub-pixel may include a switching transistor SW1, a driving transistor DR, a sensing transistor SW2, a capacitor Cst and an OLED. The sensing transistor SW2 is a transistor which can be included in the internal compensating circuit CC and performs a sensing operation for compensating driving of the sub-pixel.

The switching transistor SW1 serves to provide a data voltage supplied through the data line DL1 to a first node N1 in response to the scan signal supplied through the first scan line GL1a. The sensing transistor SW2 serves to initialize or sense a second node N2 positioned between the driving transistor DR and the OLED in response to a sensing signal supplied through the second sensing line GL1b.

In addition, the circuit configuration of the sub-pixel shown in FIG. 3 is an example for aiding in understanding of the present invention. That is, the sub-pixel according to an embodiment of the present invention is not limited thereto and may have various configurations such as 2T1C (2-transistor and 1-capacitor), 3T1C, 4T2C, 5T2C, 6T2C and 7T2C.

As shown in FIGS. 1 and 4, the touchscreen TSP includes capacitance type touch sensors Cm for sensing touch input. Capacitance can be divided into self-capacitance and mutual capacitance. Capacitance type can detect touch according to contact of a user's finger or a conductive object such as a stylus pen.

The touchscreen TSP may include Tx electrodes Tx, Rx electrodes Rx intersecting the Tx electrodes Tx, and touch sensors Cm formed at the intersections of the Tx electrodes Tx and the Rx electrodes Rx. The Tx electrodes Tx are electrodes used to apply a touch driving voltage and the Rx electrodes Rx are electrodes used to sense capacitance variation caused by the touch driving voltage. The Tx electrodes Tx are connected to Tx channels of the touch driving circuit 18 and the Rx electrodes Rx are connected to Rx channels of the touch driving circuit 18.

The touch driving circuit 18 determines whether touch by a finger or a conductive object such as a stylus pen has been applied and the position to which the touch has been applied by sensing charge variation in a touch sensor before and after the touch is applied. Thus, the touch driving circuit 18 includes a driving circuit and a determination circuit.

The driving circuit serves to output a touch driving voltage for driving the touchscreen TSP and to sense a result value. The driving circuit transfers a sensing value to the touch determination circuit. The determination circuit detects change variations before and after touch input based on the sensing value, compares the detected charge variations with a predetermined threshold value and determines positions of touch sensors having charge variations equal to or greater than the threshold value as a touch input region. The determination circuit calculates coordinates of each touch input and transmits touch data TDATA(XY) including touch input coordinate information to the host system 19.

First Embodiment

Figure 5:
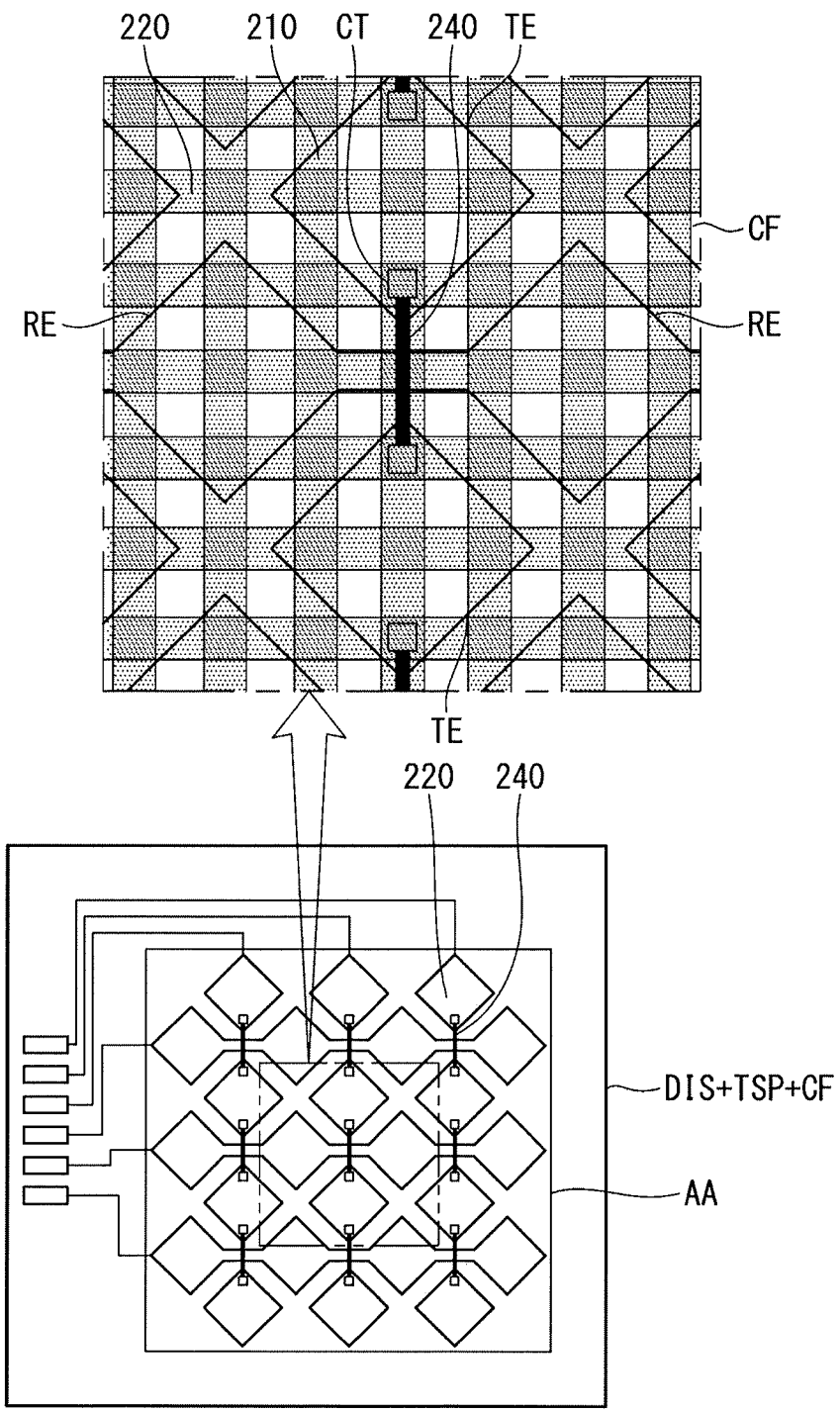
FIGS. 5 and 6 are a plan view and a cross-sectional view illustrating a display panel having a touchscreen according to a first embodiment of the present invention.
Figure 6:
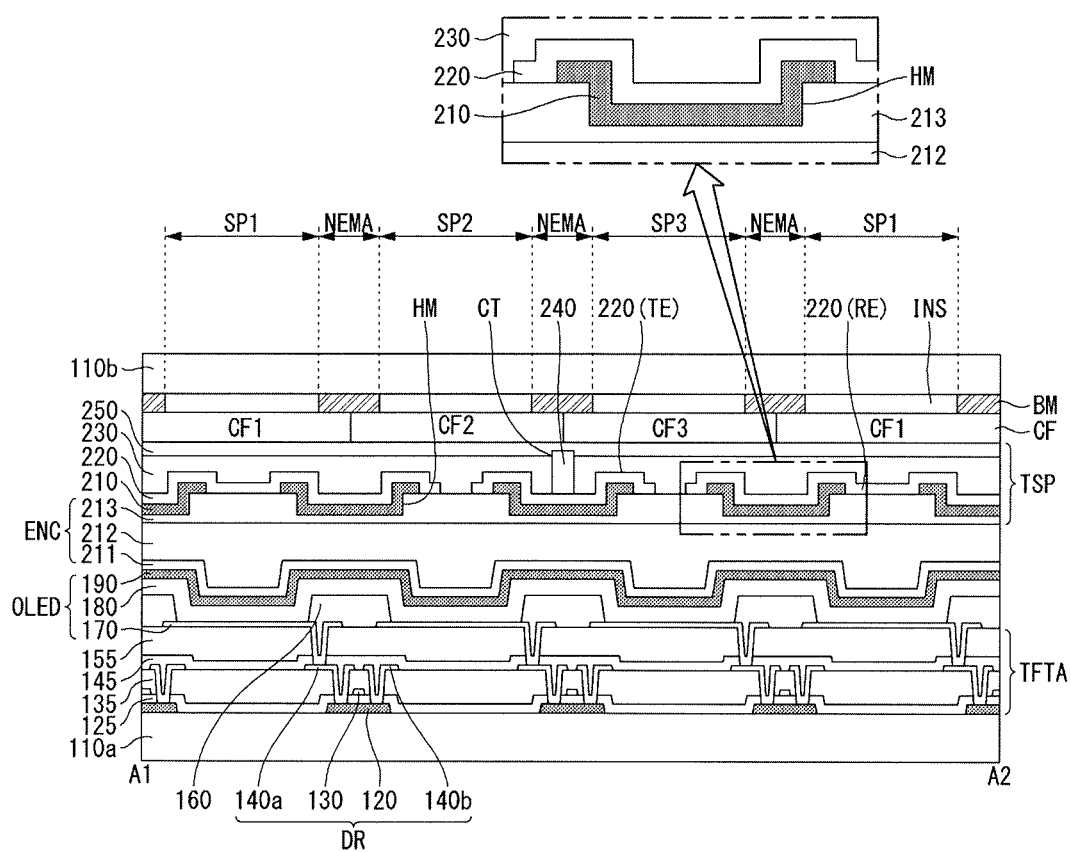
Figure 7:
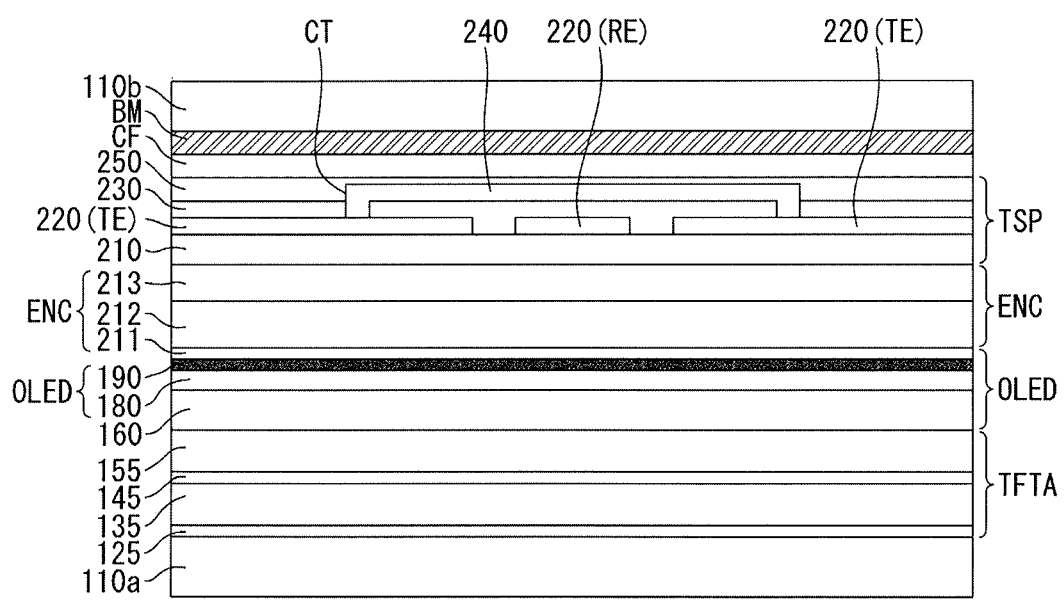
FIG. 7 is a diagram illustrating the display panel of FIG. 6 according to the first embodiment of the present invention.

FIGS. 5 and 6 are a plan view and a cross-sectional view illustrating a display panel having a touchscreen according to a first embodiment of the present invention, and FIG. 7 is a diagram illustrating the display panel of FIG. 6 according to the first embodiment of the present invention.

As shown in FIGS. 5 and 6, a display panel DIS includes a lower substrate 110a, a transistor array TFTA, OLEDs and an encapsulating substrate ENC. The lower substrate 110a and the encapsulating substrate ENC are formed of a single layer or multiple layers.

The encapsulating substrate ENC covers an active area. The encapsulating substrate ENC may include first, second and third layers 211, 212 and 213 to protect the active area from moisture or the air such as oxygen. The first layer 211 may be positioned to cover a second electrode layer 190 of the OLEDs. The second layer 212 may be positioned to cover the first layer 211. The third layer 213 may be positioned to cover the second layer 212. The encapsulating substrate ENC may be formed of a compound layer in which an organic material and an inorganic material are laminated in a mixed manner or alternately and various layered structures may be selected therefor.

The encapsulating substrate ENC includes a plurality of recesses HM depressed from the surface thereof. The recesses HM are positioned in the active area AA of the display panel DIS. Each recess HM includes a bottom surface exposing the surface of the encapsulating substrate ENC and a sidewall exposing a recessed side of the encapsulating substrate ENC. The recess HM has a rectangular shape having an almost vertical sidewall in the cross-sectional view.

The touchscreen TSP is positioned on the encapsulating substrate ENC outside the display panel DIS. The touchscreen TSP includes a lower metal layer 210, a touch electrode layer 220, a first insulating layer 230, a connecting electrode layer 240 and a second insulating layer 250. However, the second insulating layer 250 may be omitted when a color filter layer CF has electrode insulation and protection characteristics.

The lower metal layer 210 is positioned on the encapsulating substrate ENC. The lower electrode layer 210 serves to improve signal delay (RC delay) due to material characteristics of the touch electrode layer 220. The lower electrode layer 210 may be formed in a structure which can reduce the resistance of the touch electrode layer 220, for example, a line structure or a block structure in addition to the shown mesh structure. Part of the lower metal layer 210 is formed on the sidewalls and the bottom surfaces of the recesses HM provided to the encapsulating substrate ENC in addition to the surface of the encapsulating substrate ENC. The lower metal layer 210 may be formed of a material having low resistance, for example, Cu, Mo and Ti, or formed from a multi-layered film (Cu/Mo/Ti) containing one or more of such materials. However, the material of the lower metal layer 210 is not limited thereto.

The touch electrode layer 220 is positioned on the encapsulating substrate ENC. The touch electrode layer 220 serves to form Tx electrodes TE and Rx electrodes RE of the touchscreen TSP. The touch electrode layer 220 is isolated for respective electrodes and separately arranged on the encapsulating substrate ENC to form the Tx electrodes TE and the Rx electrodes RE. Part of the touch electrode layer 220 is positioned on the lower metal layer 210 and covers the part of the lower metal layer 210 positioned on the sidewalls and the bottom surfaces of the recesses HM. Accordingly, the touch electrode layer 220 and the lower metal layer 210 have regions where they are electrically connected to each other. The touch electrode layer 220 may be formed of a transparent oxide material, for example, ITO, ITZO or ITO/Ag/ITO, but the material of the touch electrode layer 220 is not limited thereto. The touch electrode layer 220 is connected to a pad 290.

The first insulating layer 230 is positioned on the touch electrode 220. The first insulating layer 230 serves to insulate and protect the lower metal layer 210 and the touch electrode layer 220 positioned on the encapsulating substrate ENC. The first insulating layer 230 has openings CT which exposes parts of the touch electrode layer 220 in areas in which the recesses HM are formed. The first insulating layer 230 may be formed of an inorganic material, for example, SiNx, SiO2, photoacrylate or photoresist (PR), but the material of the first insulating layer 230 is not limited thereto.

The connecting electrode layer 240 is positioned on the first insulating layer 230. The connecting electrode layer 240 electrically connects a part of the touch electrode layer 220 disposed at one side and a part thereof disposed at the other side through the opening CT (that is, the opening may be defined as a contact bridge). That is, the connecting electrode layer 240 serves to electrically connect the Tx electrodes TE and the Rx electrodes RE separately arranged on the encapsulating substrate ENC.

For example, the connecting electrode layer 240 is arranged in the vertical and horizontal directions. The connecting electrode layer arranged in the horizontal direction may electrically connect first connecting electrode layer parts separately arranged to constitute the Rx electrodes RE and the connecting electrode layer arranged in the vertical direction may electrically connect second connecting electrode layer parts separately arranged to constitute the Tx electrodes TE. The connecting electrode layer 240 may be formed of a low-resistance material, for example, Al or Mo, or formed from a multi-layered film (Al/Mo) made of such materials but the material of the connecting electrode layer 240 is not limited thereto.

The second insulating layer 250 is positioned on the first insulating layer 230. The second insulating layer 250 serves to insulate and protect all structures of the touchscreen TSP including the connecting electrode layer 240. The second insulating layer 250 may be formed of an organic material having insulating capability and surface flatness while filling the recesses HM of the encapsulating substrate ENC, for example, an overcoat layer, polyimide, benzocyclobutene series resin, acrylate or photoacrylate, but the material thereof is not limited thereto.

The color filter layer CF is positioned on the second insulating layer 250. A first color filter CF1, a second color filter CF2 and a third color filter CF3 included in the color filter layer CF are arranged corresponding to a first sub-pixel SP1, a second sub-pixel SF2 and a third sub-pixel SP3. For example, the first color filter CF1 can change white light to red light, the second color filter CF2 can change white light to green light and the third color filter CF3 can change white light to blue light. However, the arrangement order of the color filters is not limited thereto.

In the shown structure, the display panel DIS, the touchscreen TSP and color filter layers CF are sequentially laminated and integrated and thus the color filter layer CF is positioned on the touchscreen TSP. However, the color filter layer CF may be positioned under the touchscreen TSP or inside of the display panel DIS.

A black matrix BM and a third insulating layer INS may be positioned on the color filter layer CF. The third insulating layer INS corresponds to the emission areas of the sub-pixels and the black matrix BM corresponds to non-emission areas NEMA between sub-pixels. For example, a center of the black matrix BM can be positioned over a center a recess H and its corresponding lower metal layer 210, and over a center of a corresponding bank layer 160, in order to help prevent light from mixing between two adjacent sub-pixels while also helping to funnel light to the outside. An upper substrate 110B is positioned on the black matrix BM and the third insulating layer INS. The third insulating layer INS may be omitted depending on the material of the upper substrate 110b. Although the black matrix BM is positioned under the upper substrate 110b as an example, the black matrix BM may be positioned inside of the touchscreen TSP or the display panel DIS.

As shown in FIGS. 5 to 7, the transistor array TFTA is positioned on the lower substrate 110a. Although the lower substrate 110a is formed of a single layer in the figure, the lower substrate 110a may be formed in a multi-layer structure based on multiple films. A buffer layer may be additionally interposed between the lower substrate 110a and the transistor array TFTA.

The transistor array TFTA may include an active layer 120, a gate insulating layer 125, a gate metal layer 130, an interlevel insulating layer 135, source and drain metal layers 140a and 140b, a passivation layer 145 and a planarization layer 155. The driving transistor DR is provided by the layers constituting the transistor array TFTA, which will be described below.

The active layer 120 may be positioned on the lower substrate 110a and may constitute a semiconductor layer of the driving transistor DR. The gate insulating layer 125 may be positioned on the buffer layer and may cover the active layer 120. The gate metal layer 130 may be positioned on the gate insulating layer 125 and disposed in a region corresponding to the active layer 120 and may constitute the gate electrode of the driving transistor DR.

The interlevel insulating layer 135 may be positioned on the gate insulating layer 125 and may cover the gate metal layer 130. The source and drain metal layers 140a and 140b may be positioned on the interlevel insulating layer 135, may respectively contact source and drain regions of the active layer 120 and may constitute the source electrode and the drain electrode of the driving transistor DR. The passivation layer 145 may be positioned on the interlevel insulating layer 135 and may cover the source and drain metal layers 140a and 140b. The planarization layer 155 may be positioned on the passivation layer 145 and may planarize the surface thereof.

The OLED may include a first electrode layer 170, an organic emitting layer 180 and the second electrode layer 190. The OLED may be positioned on the transistor array TFTA and electrically connected to the driving transistor DR to emit light toward the upper substrate 110b (top emission). The OLED will be described in detail below.

The first electrode layer 170 may be positioned on the planarization layer 155 and electrically connected to the drain metal layer 140a of the driving transistor DR through a contact hole formed in the planarization layer 155. The first electrode layer 170 may be isolated for respective sub-pixels through the bank layer 160 positioned on the planarization layer 155 and used as an anode electrode or a cathode electrode. The first electrode layer 170 may be formed as a single layer or multiple layers including at least a reflective electrode layer and a transparent electrode layer. The organic emitting layer 180 may be positioned on the first electrode layer 170 and formed in a structure including a single emitting layer or two or more emitting layers and a charge generating layer interposed therebetween. The second electrode layer 190 may be positioned on the organic emitting layer 180 and used as a cathode electrode or an anode electrode.

In the first embodiment illustrated in FIGS. 5 to 7, the recesses HM are formed on the encapsulating substrate ENC and the lower metal layer 210 is formed in the recesses HM. The lower metal layer 210 formed on the encapsulating substrate ENC is electrically connected to the touch electrode layer 220 to provide a structure which can reduce the resistance of the touch electrode layer 220. Accordingly, it is possible to solve a signal delay (RC delay) problem caused by material characteristics of the touch electrode layer 220 according to the first embodiment.

In addition, the recesses HM and the lower metal layer 210 formed therein block light generated from the OLED of a specific sub-pixel from affecting neighboring sub-pixels. This will be described in detail below.

The recesses HM are positioned corresponding to the bank layer 160 (or non-emission areas NEMA) through which lights generated from the OLEDs are not emitted. Most lights generated from the OLEDs propagate upward having straight propagation property. The propagating lights which are white lights are changed to red, green or blue lights through the color filter layer CF and emitted.

Lights generated in certain regions, such as light generated in a portion in proximity to the bank layer 160 or generated at a specific position cause interference which affects neighboring sub-pixels.

However, when the recesses HM are formed on the surface of the encapsulating substrate ENC in the light emission direction of the OLEDs and the lower metal layer 210 is formed therein, lights from the OLEDs are blocked by the sidewalls of the recesses HM from reaching neighboring sub-pixels.

Accordingly, it is possible to solve problems regarding interference of lights generated in some sub-pixels, which affects neighboring sub-pixels, and color mixture of lights caused thereby as well as the signal delay (RC delay) problem due to the material characteristics of the touch electrode layer according to the first embodiment.

Moreover, improvement of optical functions including a luminance viewing angle and a color viewing angle of the display device can be achieved as a result of continuous research based on the structure according to the first embodiment. This will be described below.

Second Embodiment

Figure 8:
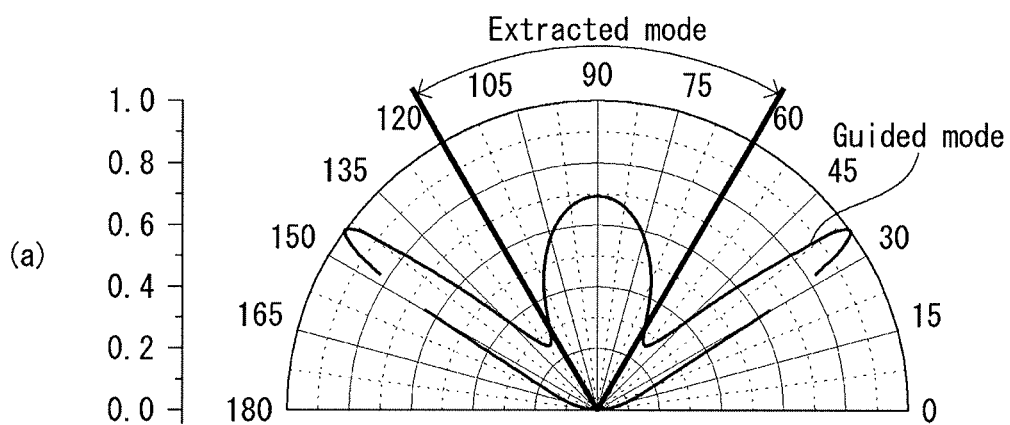
FIG. 8, including (a) and (b), is a diagram illustrating luminance variation according to a viewing angle of a top emission type device in a material and a refractive index, and a critical angle of a medium positioned in a direction in which lights are emitted according to an embodiment of the present invention.
Figure 9:
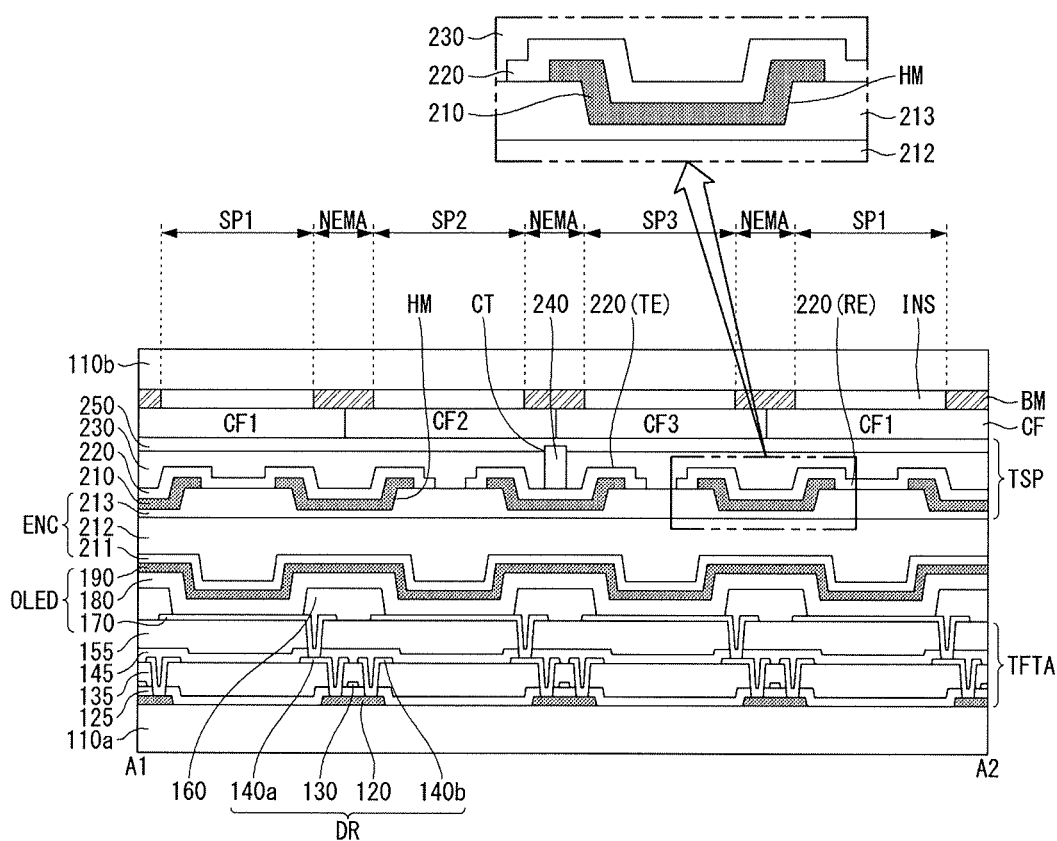
FIG. 9 is a cross-sectional view illustrating a display panel having a touchscreen according to a second embodiment of the present invention.

FIG. 8, including (a) and (b), illustrates luminance variation according to a viewing angle of a top emission type device in a material and a refractive index and a critical angle of a medium positioned in a direction in which lights are emitted according to embodiments, and FIG. 9 is a cross-sectional view illustrating a display panel having a touchscreen according to a second embodiment of the present invention.

Referring to (a) of FIG. 8, lights emitted from a top emission type device pass through an OLED layer and an encapsulating substrate which are high refractive layers to encounter low refraction (when emitted to the air). Here, lights emitted at angles equal to or less than 34° are total-reflected to be confined within the top emission type device because lights emitted in the range of 120° to 60° (extracted mode) among the lights emitted from the top emission type device are emitted to outside but the remaining lights are not emitted to outside. Accordingly, when a medium positioned in the light emission direction of the top emission type device has the same refractive index as that of the top emission type device or a large quantity of light is emitted within a critical angle (33.7°), light emission characteristics can be improved.

Since the top emission type device has the aforementioned characteristic, optical loss can be reduced by emitting lights in the ranges of 34° to 60° and 154° to 120° (guided mode) (lights having relatively low emission characteristics) other than lights within the range of 120° to 60° (extracted mode), among the lights emitted from the top emission type device, to outside.

As shown in FIGS. 5 to 9, the display panel DIS includes the lower substrate 110a, the transistor array TFTA, the OLEDs and the encapsulating substrate ENC. The lower substrate 110a and the encapsulating substrate ENC are formed as a single layer or multiple layers.

The encapsulating substrate ENC covers an active area. The encapsulating substrate ENC may include first to third layers 211 to 213 to protect the active area from moisture or the air such as oxygen. The first layer 211 may be positioned to cover a second electrode layer 190 of the OLEDs. The second layer 212 may be positioned to cover the first layer 211. The third layer 213 may be positioned to cover the second layer 212. The encapsulating substrate ENC may be formed of a compound layer in which an organic material and an inorganic material are laminated in a mixed manner or alternately and various layered structures may be selected therefor.

The encapsulating substrate ENC includes a plurality of recesses HM depressed from the surface thereof. The recesses HM are positioned in the active area AA of the display panel DIS. Each recess HM includes a bottom surface exposing the surface of the encapsulating substrate ENC and an inclined sidewall exposing a recessed side of the encapsulating substrate ENC.

The touchscreen TSP is positioned on the encapsulating substrate ENC outside the display panel DIS. The touchscreen TSP includes a lower metal layer 210, a touch electrode layer 220, a first insulating layer 230, a connecting electrode layer 240 and a second insulating layer 250. However, the second insulating layer 250 may be omitted when a color filter layer CF has electrode insulation and protection characteristics.

The lower metal layer 210 is positioned on the encapsulating substrate ENC. The lower electrode layer 210 serves to improve signal delay (RC delay) due to material characteristics of the touch electrode layer 220. The lower electrode layer 210 may be formed in a structure which can reduce the resistance of the touch electrode layer 220, for example, a line structure, a mesh structure or a block structure. Part of the lower metal layer 210 is formed on the sidewalls and the bottom surfaces of the recesses HM provided to the encapsulating substrate ENC in addition to the surface of the encapsulating substrate ENC. The lower metal layer 210 may be formed of a material having low resistance, for example, Cu, Mo and Ti, or formed from a multi-layered film (Cu/Mo/Ti) containing one or more of such materials. However, the material of the lower metal layer 210 is not limited thereto.

The touch electrode layer 220 is positioned on the encapsulating substrate ENC. The touch electrode layer 220 serves to form Tx electrodes TE and Rx electrodes RE of the touchscreen TSP. The touch electrode layer 220 is isolated for respective electrodes and separately arranged on the encapsulating substrate ENC to form the Tx electrodes TE and the Rx electrodes RE. Part of the touch electrode layer 220 is positioned on the lower metal layer 210 and covers the part of the lower metal layer 210 positioned on the sidewalls and the bottom surfaces of the recesses HM. Accordingly, the touch electrode layer 220 and the lower metal layer 210 have regions where they are electrically connected to each other. The touch electrode layer 220 may be formed of a transparent oxide material, for example, ITO, ITZO or ITO/Ag/ITO, but the material of the touch electrode layer 220 is not limited thereto.

The first insulating layer 230 is positioned on the touch electrode layer 220. The first insulating layer 230 serves to insulate and protect the lower metal layer 210 and the touch electrode layer 220 positioned on the encapsulating substrate ENC. The first insulating layer 230 has openings CT which exposes parts of the touch electrode layer 220 in areas in which the recesses HM are formed. The first insulating layer 230 may be formed of an inorganic material, for example, SiNx, SiO2, photoacrylate or photoresist (PR), but the material of the first insulating layer 230 is not limited thereto.

The connecting electrode layer 240 is positioned on the first insulating layer 230. The connecting electrode layer 240 electrically connects a part of the touch electrode layer 220 disposed at one side and a part thereof disposed at the other side through the opening CT (that is, the opening may be defined as a contact bridge). That is, the connecting electrode layer 240 serves to electrically connect the Tx electrodes TE and the Rx electrodes RE separately arranged on the encapsulating substrate ENC.

For example, the connecting electrode layer 240 is arranged in the vertical and horizontal directions. The connecting electrode layer arranged in the horizontal direction may electrically connect connecting electrode layer parts separately arranged to constitute the Rx electrodes RE and the connecting electrode layer arranged in the vertical direction may electrically connect connecting electrode layer parts separately arranged to constitute the Tx electrodes TE. The connecting electrode layer 240 may be formed of a low-resistance material, for example, Al or Mo, or formed from a multi-layered film (Al/Mo) made of such materials but the material of the connecting electrode layer 240 is not limited thereto.

The second insulating layer 250 is positioned on the first insulating layer 230. The second insulating layer 250 serves to insulate and protect all structures of the touchscreen TSP including the connecting electrode layer 240. The second insulating layer 250 may be formed of an organic material having insulating capability and surface flatness while filling the recesses HM of the encapsulating substrate ENC, for example, an overcoat layer, polyimide, benzocyclobutene series resin, acrylate or photoacrylate, but the material thereof is not limited thereto.

The color filter layer CF is positioned on the second insulating layer 250. A first color filter CF1, a second color filter CF2 and a third color filter CF3 included in the color filter layer CF are arranged corresponding to a first sub-pixel SP1, a second sub-pixel SF2 and a third sub-pixel SP3. For example, the first color filter CF1 can change white light to red light, the second color filter CF2 can change white light to green light and the third color filter CF3 can change white light to blue light. However, the arrangement order of the color filters is not limited thereto.

In the shown structure, the display panel DIS, the touchscreen TSP and color filter layers CF are sequentially laminated and integrated and thus the color filter layer CF is positioned on the touchscreen TSP. However, the color filter layer CF may be positioned under the touchscreen TSP or inside of the display panel DIS.

A black matrix BM and a third insulating layer INS may be positioned on the color filter layer CF. The third insulating layer INS corresponds to the emission areas of the sub-pixels and the black matrix BM corresponds to non-emission areas NEMA between sub-pixels. An upper substrate 110B is positioned on the black matrix BM and the third insulating layer INS. The third insulating layer INS may be omitted depending on the material of the upper substrate 110b. Although the black matrix BM is positioned under the upper substrate 110b as an example, the black matrix BM may be positioned inside of the touchscreen TSP or the display panel DIS.

The transistor array TFTA is positioned on the lower substrate 110a. Although the lower substrate 110a is formed of a single layer in the figure, the lower substrate 110a may be formed in a multi-layer structure based on multiple films. A buffer layer may be additionally interposed between the lower substrate 110a and the transistor array TFTA.

The transistor array TFTA may include an active layer 120, a gate insulating layer 125, a gate metal layer 130, an interlevel insulating layer 135, source and drain metal layers 140a and 140b, a passivation layer 145 and a planarization layer 155. The driving transistor DR is provided by the layers constituting the transistor array TFTA, which will be described below.

The active layer 120 may be positioned on the lower substrate 110a and may constitute a semiconductor layer of the driving transistor DR. The gate insulating layer 125 may be positioned on the buffer layer 115 and may cover the active layer 120. The gate metal layer 130 may be positioned on the gate insulating layer 125 and disposed in a region corresponding to the active layer 120 and may constitute the gate electrode of the driving transistor DR.

The interlevel insulating layer 135 may be positioned on the gate insulating layer 125 and may cover the gate metal layer 130. The source and drain metal layers 140a and 140b may be positioned on the interlevel insulating layer 135, may respectively contact source and drain regions of the active layer 120 and may constitute the source electrode and the drain electrode of the driving transistor DR. The passivation layer 145 may be positioned on the interlevel insulating layer 135 and may cover the source and drain metal layers 140a and 140b. The planarization layer 155 may be positioned on the passivation layer 145 and may planarize the surface thereof.

The OLED may include a first electrode layer 170, an organic emitting layer 180 and the second electrode layer 190. The OLED may be positioned on the transistor array TFTA and electrically connected to the driving transistor DR to emit light toward the upper substrate 110b (top emission). The OLED will be described in detail below.

The first electrode layer 170 may be positioned on the planarization layer 155 and electrically connected to the drain metal layer 140a of the driving transistor DR through a contact hole formed in the planarization layer 155. The first electrode layer 170 may be isolated for respective sub-pixels through the bank layer 160 positioned on the planarization layer 155 and used as an anode electrode or a cathode electrode. The first electrode layer 170 may be formed as a single layer or multiple layers including at least a reflective electrode layer and a transparent electrode layer. The organic emitting layer 180 may be positioned on the first electrode layer 170 and formed in a structure including a single emitting layer or two or more emitting layers and a charge generating layer interposed therebetween. The second electrode layer 190 may be positioned on the organic emitting layer 180 and used as a cathode electrode or an anode electrode.

In the second embodiment illustrated in FIG. 9, the recesses HM are formed on the encapsulating substrate ENC and the lower metal layer 210 is formed in the recesses HM. The lower metal layer 210 formed on the encapsulating substrate ENC is electrically connected to the touch electrode layer 220 to provide a structure which can reduce the resistance of the touch electrode layer 220. Accordingly, it is possible to solve a signal delay (RC delay) problem caused by material characteristics of the touch electrode layer 220 according to the second embodiment.

In addition, the recesses HM and the lower metal layer 210 formed therein block light generated from the OLED of a specific sub-pixel from affecting neighboring sub-pixels. Further, the recesses HM and the lower metal layer 210 formed therein provide a structure which can guide lights upward such that out-coupling can be improved when light generated from the OLED of a specific sub-pixel is emitted through the emission area. This will be described in detail below.

The recesses HM are positioned corresponding to the bank layer 160 (or non-emission areas NEMA) through which lights generated from the OLEDs are not emitted. Most lights generated from the OLEDs propagate upward having straight propagation property. The propagating lights which are white lights are changed to red, green or blue lights through the color filter layer CF and emitted.

Lights generated in certain regions, such as light generated in a portion in proximity to the bank layer 160 or generated at a specific position cause interference which affects neighboring sub-pixels.

However, when the recesses HM are formed on the surface of the encapsulating substrate ENC in the light emission direction of the OLEDs and the lower metal layer 210 is formed therein, some lights from the OLEDs are blocked by the (inclined) sidewalls of the recesses HM to be guided upward instead of reaching neighboring sub-pixels. That is, lights blocked by the inclined sidewalls of the recesses HM refract and thus are guided upward and emitted to outside without being lost through reflection to the inside of the device. The portion near the third layer 213 of the encapsulating substrate ENC corresponds to the lower side of the recesses HM, and the portion near touch electrode layer 220 corresponds to the upper side of the recesses HM.

Figure 11:
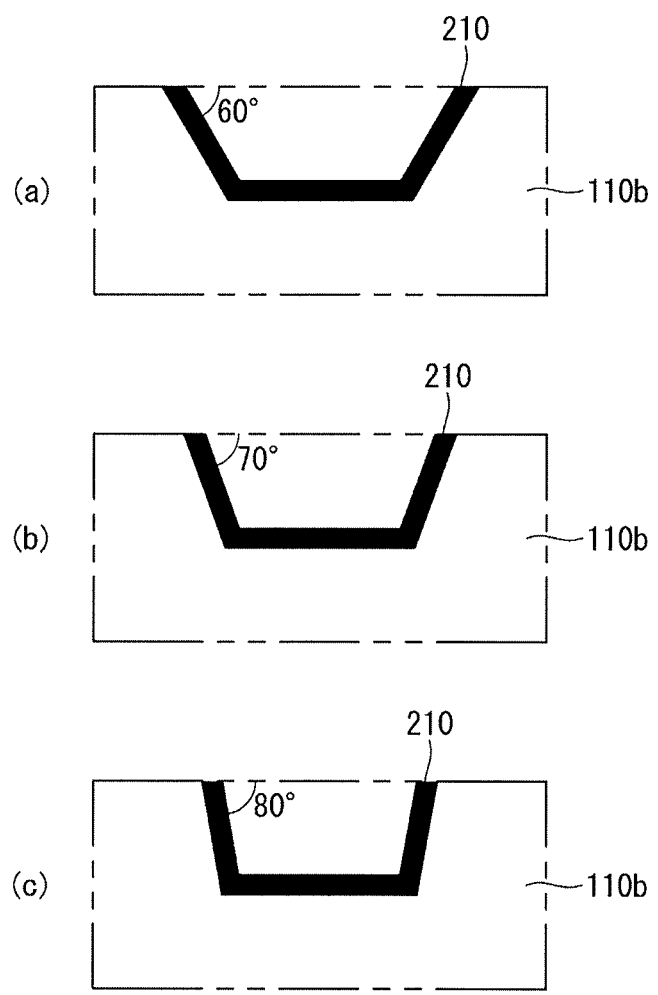
FIGS. 11 and 12 are diagrams showing angles of recesses which can be obtained based on simulation results.
Figure 12:
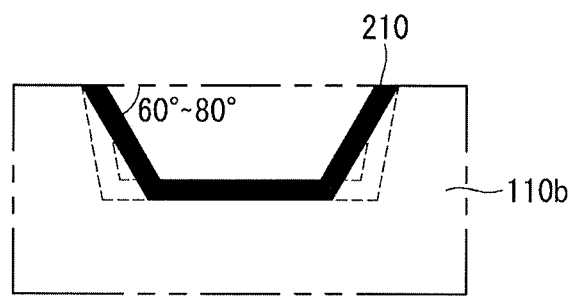

FIG. 10, including (a) and (b), is a diagram showing simulation results based on the second embodiment of the present invention, and FIGS. 11 and 12 are diagrams showing angles of the sidewall of a recess which can be obtained based on simulation results according to embodiments.

The simulation results shown in FIG. 10 are obtained under the condition that the refractive index of the material of the device is 1.8 and light input at the angle of 50° to the normal of one side of the recess HM is emitted to the air. The aforementioned condition is employed because the top emission type device needs to emit a large amount of light within the critical angle (33.7°) in the direction in which lights are emitted in order to perform simulations at arbitrary angles at which total reflection of light occurs inside of the device. Also, (b) of FIG. 10 illustrates simulation results for showing variations in emitted lights (refraction/reflection of lights) depending on the angle of the inclined sidewall of the recess HM positioned in proximity to an emission area.

As can be known from the simulation results shown in FIG. 10, refraction which can cause light generated from the OLED to be guided and emitted upward occurs when the inclined sidewall of the recess HM has angles of 80°, 70° and 60° with respect to the surface of the encapsulating substrate ENC. In other words, light generated from the OLED is propagated at a reflection angle formed by the inclined sidewall of the recess HM and thus emitted to outside of the display panel (upward). That is, lights confined inside of the display panel are also emitted to outside of the display panel.

However, when the inclined sidewall of the recess HM has an angle of 50° or lower or 90° or higher, reflection which cannot cause light from the OLED to be guided to be emitted upward occurs. In other words, light generated from the OLED is propagated at the reflection angle formed by the inclined sidewall of the recess HM and thus the light is input into the display panel (e.g., reflected inside), instead of being emitted to outside of the display panel.

As shown in FIG. 11, it is desirable that the recess HM have an isosceles trapezoidal shape (e.g., the cross-section of the recess HM can be trapezoidal shaped) in which the angle formed between the surface of the encapsulating substrate ENC and an inclined side of the recess HM is (a) 60°, (b) 70° or (c) 80°. Furthermore, the angle may be optimized within the range of 60° to 80° through repeated tests, as shown in the simulation results shown in FIG. 10.

According to the simulation results, the display panel including the touchscreen having the recess HM having a trapezoidal shape, as in the second embodiment, can also emit lights confined thereinside (e.g., guide reflected light back to the outside), and thus optical functions including a luminance viewing angle and a color viewing angle can be improved (light emission efficiency).

Therefore, it is possible to solve a signal delay (RC delay) problem due to the material characteristics of the touch electrode layer and problems regarding interference of lights generated in some sub-pixels, which affects neighboring sub-pixels, and color mixture of lights caused thereby and to improve optical functions including the luminance viewing angle and the color viewing angle (light emission efficiency) according to the second embodiment.

As described above, the embodiments of the present invention can solve or address a signal delay (RC delay) problem due to the material characteristics of the touch electrode layer and problems regarding interference of lights generated in some sub-pixels, which affects neighboring sub-pixels, and color mixture of lights caused thereby. In addition, the embodiments of the present invention can also emit lights confined inside of the display panel to improve optical functions including the luminance viewing angle and the color viewing angle (light emission efficiency).

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the scope of the present invention is not limited by the embodiments discussed above. The scope of the present invention shall be construed on the basis of the accompanying claims in such a manner that all of the technical ideas included within the scope equivalent to the claims belong to the present disclosure.

What is claimed is:

1. An electronic device having a touch sensor, the electronic device comprising:
    a display panel including an active area and an encapsulating substrate covering the active area;
    a plurality of recesses in a surface of the encapsulating substrate; and
    a touchscreen including:
    a lower metal layer disposed in the plurality of recesses, and
    a touch electrode layer electrically connected to a part of the lower metal layer and including touch driving electrodes and touch sensing electrodes separately arranged on the encapsulating substrate,
    wherein each of the plurality of recesses in the encapsulating substrate overlaps with a corresponding portion of a bank layer defining a plurality of sub-pixels,
    wherein a center of one of the plurality of recesses overlaps with a center of a corresponding portion of the bank layer, and
    wherein the plurality of recesses, the lower metal layer and the bank layer are configured to prevent interference between adjacent sub-pixels among the plurality of sub-pixels and funnel light out of the electronic device.

2. The electronic device according to claim 1, wherein the touch electrode layer includes a transparent material and the lower metal layer includes an opaque material.

3. The electronic device according to claim 1, wherein the touch electrode layer includes a transparent oxide material including at least one of ITO or ITZO, and
    wherein the lower metal layer includes a metal material having a lower resistance than the transparent oxide material of the touch electrode layer.

4. The electronic device according to claim 1, wherein a cross section of each of the plurality of recesses has a rectangular shape or a trapezoidal shape.

5. The electronic device according to claim 1, wherein each of the plurality of recesses has a trapezoidal shape in which an upper side is wider than a lower side in a cross-sectional view of each of the plurality of recesses.

6. The electronic device according to claim 1, wherein each of the plurality of recesses has an isosceles trapezoidal shape with an angle formed between the surface of the encapsulating substrate and an inclined side of each of the plurality of recess, the angle being in a range of approximately 60° to 80°.

7. The electronic device according to claim 1, wherein an imaginary line intersects one of the plurality of recesses and a corresponding portion of the bank layer.

8. The electronic device according to claim 1, wherein the touchscreen further comprises:
 a first insulating layer covering the lower metal layer and the touch electrode layer;
 a connecting electrode layer positioned on the first insulating layer and electrically connecting two adjacent touch electrode layer parts of the touch electrode layer; and
 a second insulating layer positioned on the first insulating layer.

9. The electronic device according to claim 8, further comprising a color filter layer positioned on the touchscreen, wherein the color filter layer is positioned on the second insulating layer.

10. The electronic device according to claim 1, further comprising:
 a black matrix,
 wherein corresponding portions of the black matrix, corresponding portions of the bank layer and corresponding portions of the lower metal layer in the plurality of recesses in the encapsulating substrate are configured to prevent mixing of different colored light between adjacent sub-pixels among the plurality of sub-pixels and funnel light out of the electronic device.

11. A display device comprising:
 a display panel;
 an encapsulating substrate covering an active area of the display panel;
 a plurality of recesses in a surface of the encapsulating substrate; and
 a lower metal layer disposed in the plurality of recesses in the encapsulating substrate,
 wherein each of the plurality of recesses in the encapsulating substrate overlaps with a corresponding portion of a bank layer defining a plurality of sub-pixels of the display panel,
 wherein a center of one of the plurality of recesses overlaps with a center of a corresponding portion of the bank layer, and
 wherein the plurality of recesses, the lower metal layer and the bank layer are configured to prevent interference between adjacent sub-pixels among the plurality of sub-pixels and funnel light out of the display device.

12. The display device according to claim 11, wherein each of the plurality of recesses has a trapezoidal shape in which an upper side is wider than a lower side in a cross-sectional view of the plurality of recesses.

13. The display device according to claim 11, wherein each of the plurality of recesses has an isosceles trapezoidal shape in which an angle formed between the surface of the encapsulating substrate and an inclined side of each of the plurality of recesses is in a range of approximately 60° to 80°.

14. The display device according to claim 13, wherein the inclined sides of the plurality of recesses are configured to block light from adjacent sub-pixels from mixing and refract or reflect light from sub-pixels to an outside of the display device.

15. The display device according to claim 11, wherein the plurality of recesses are positioned corresponding to non-emission areas of the display panel.

16. The display device according to claim 11, further comprising:
 a touch electrode layer electrically connected to a part of the lower metal layer and including touch driving electrodes and touch sensing electrodes separately arranged on the encapsulating substrate.

17. The display device according to claim 16, wherein the lower metal layer is more opaque than the touch electrode layer, and the lower metal layer has a lower resistance than the touch electrode layer.

18. The display device according to claim 11,
 wherein an imaginary line intersects one of the plurality of recesses and a corresponding portion of the bank layer between two adjacent sub-pixels among the plurality of sub-pixels.

* * * * *